(12) United States Patent
Kida

(10) Patent No.: US 10,960,667 B2
(45) Date of Patent: Mar. 30, 2021

(54) ELECTRONIC DEVICE, LIQUID DISCHARGE HEAD, LIQUID DISCHARGE DEVICE, LIQUID DISCHARGE APPARATUS, AND ELECTRONIC APPARATUS

(71) Applicant: Hitoshi Kida, Kanagawa (JP)

(72) Inventor: Hitoshi Kida, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/299,284

(22) Filed: Mar. 12, 2019

(65) Prior Publication Data

US 2019/0283420 A1 Sep. 19, 2019

(30) Foreign Application Priority Data

Mar. 19, 2018 (JP) .............................. JP2018-050843
Dec. 20, 2018 (JP) .............................. JP2018-238742

(51) Int. Cl.
*B41J 2/14* (2006.01)
*H01L 41/04* (2006.01)
*H01L 41/047* (2006.01)
*B41J 2/335* (2006.01)
*H01L 41/09* (2006.01)

(52) U.S. Cl.
CPC ......... *B41J 2/14201* (2013.01); *B41J 2/3351* (2013.01); *H01L 41/042* (2013.01); *H01L 41/0475* (2013.01); *H01L 41/0973* (2013.01); *B41J 2002/14491* (2013.01)

(58) Field of Classification Search
CPC .......... B41J 2/14072; B41J 2002/14491; B41J 2/3351
See application file for complete search history.

(56) References Cited

U.S. PATENT DOCUMENTS

| 9,718,270 B2 * | 8/2017 | Kida | .................... B41J 2/14233 |
| 2005/0133898 A1 * | 6/2005 | Ito | ........................ B41J 2/14209 257/686 |
| 2012/0127254 A1 * | 5/2012 | Yamamoto | ............. B41J 2/3351 347/200 |
| 2012/0212547 A1 | 8/2012 | Takemoto et al. | |

(Continued)

FOREIGN PATENT DOCUMENTS

| JP | 8-108558 | 4/1996 |
| JP | 2009-107266 | 5/2009 |

(Continued)

*Primary Examiner* — Shelby L Fidler
(74) *Attorney, Agent, or Firm* — Harness, Dickey & Pierce, P.L.C.

(57) ABSTRACT

An electronic device includes a switching element, a first common-electrode wiring, at least a part of the first common-electrode wiring being covered with the switching element, a plurality of second common-electrode wirings branched from the part of the first common-electrode wiring covered with the switching element, a plurality of individual power-output terminals arranged in a row in the switching element, and a plurality of individual-electrode wirings arranged in a row, the plurality of individual-electrode wirings being connected to the plurality of individual power-output terminals, respectively. Each of the plurality of second common-electrode wirings is disposed between the plurality of individual-electrode wirings.

22 Claims, 15 Drawing Sheets

(56) References Cited

U.S. PATENT DOCUMENTS

| | | |
|---|---|---|
| 2012/0229542 A1 | 9/2012 | Kida |
| 2014/0022305 A1 | 1/2014 | Kida |
| 2015/0029270 A1 | 1/2015 | Takemoto et al. |
| 2016/0031212 A1 | 2/2016 | Kida |
| 2016/0152025 A1 | 6/2016 | Kida |
| 2016/0279933 A1* | 9/2016 | Arai .................... B41J 2/14233 |
| 2017/0266971 A1* | 9/2017 | Hirai .................... B41J 2/14072 |
| 2017/0266972 A1* | 9/2017 | Hirai .................... B41J 2/14233 |
| 2018/0141336 A1 | 5/2018 | Kida et al. |
| 2018/0146551 A1 | 5/2018 | Kida |

FOREIGN PATENT DOCUMENTS

| | | |
|---|---|---|
| JP | 2009-154519 | 7/2009 |
| JP | 2012-064756 | 3/2012 |

\* cited by examiner

CONVEYING DIRECTION

ELECTRONIC DEVICE, LIQUID DISCHARGE HEAD, LIQUID DISCHARGE DEVICE, LIQUID DISCHARGE APPARATUS, AND ELECTRONIC APPARATUS

CROSS-REFERENCE TO RELATED APPLICATIONS

This patent application is based on and claims priority pursuant to 35 U.S.C. § 119(a) to Japanese Patent Application No. 2018-050843, filed on Mar. 19, 2018, and Japanese Patent Application No. 2018-238742, filed on Dec. 20, 2018, in the Japan Patent Office, the entire disclosure of each of which is hereby incorporated by reference herein.

BACKGROUND

Technical Field

The present disclosure relates to an electronic device, a liquid discharge head, a liquid discharge device, a liquid discharge apparatus, and an electronic apparatus.

Discussion of the Background Art

A liquid discharge head connected to a wiring member is known. The wiring member mounts a switching element that controls drive power supplied to the respective pressure generating elements of the liquid discharge head.

A thermal head is known that includes a pattern to be connected to a common electrode pattern communicating with a plurality of heating resistors. The pattern is disposed immediately below a plurality of drive integrated circuits (ICs). The thermal head includes an extension pattern extending from the pattern through the drive ICs. The extension pattern is connected to the common electrode pattern of the heating resistor side.

SUMMARY

In an aspect of the present disclosure, a novel electronic device is provided that includes a switching element, a first common-electrode wiring, at least a part of the first common-electrode wiring being covered with the switching element, a plurality of second common-electrode wirings branched from the part of the first common-electrode wiring covered with the switching element, a plurality of individual power-output terminals arranged in a row in the switching element, and a plurality of individual-electrode wirings arranged in a row, the plurality of individual-electrode wirings being connected to the plurality of individual power-output terminals, respectively. Each of the plurality of second common-electrode wirings is disposed between the plurality of individual-electrode wirings.

BRIEF DESCRIPTION OF THE DRAWINGS

The aforementioned and other aspects, features, and advantages of the present disclosure would be better understood by reference to the following detailed description when considered in connection with the accompanying drawings, wherein.

Figure 1:
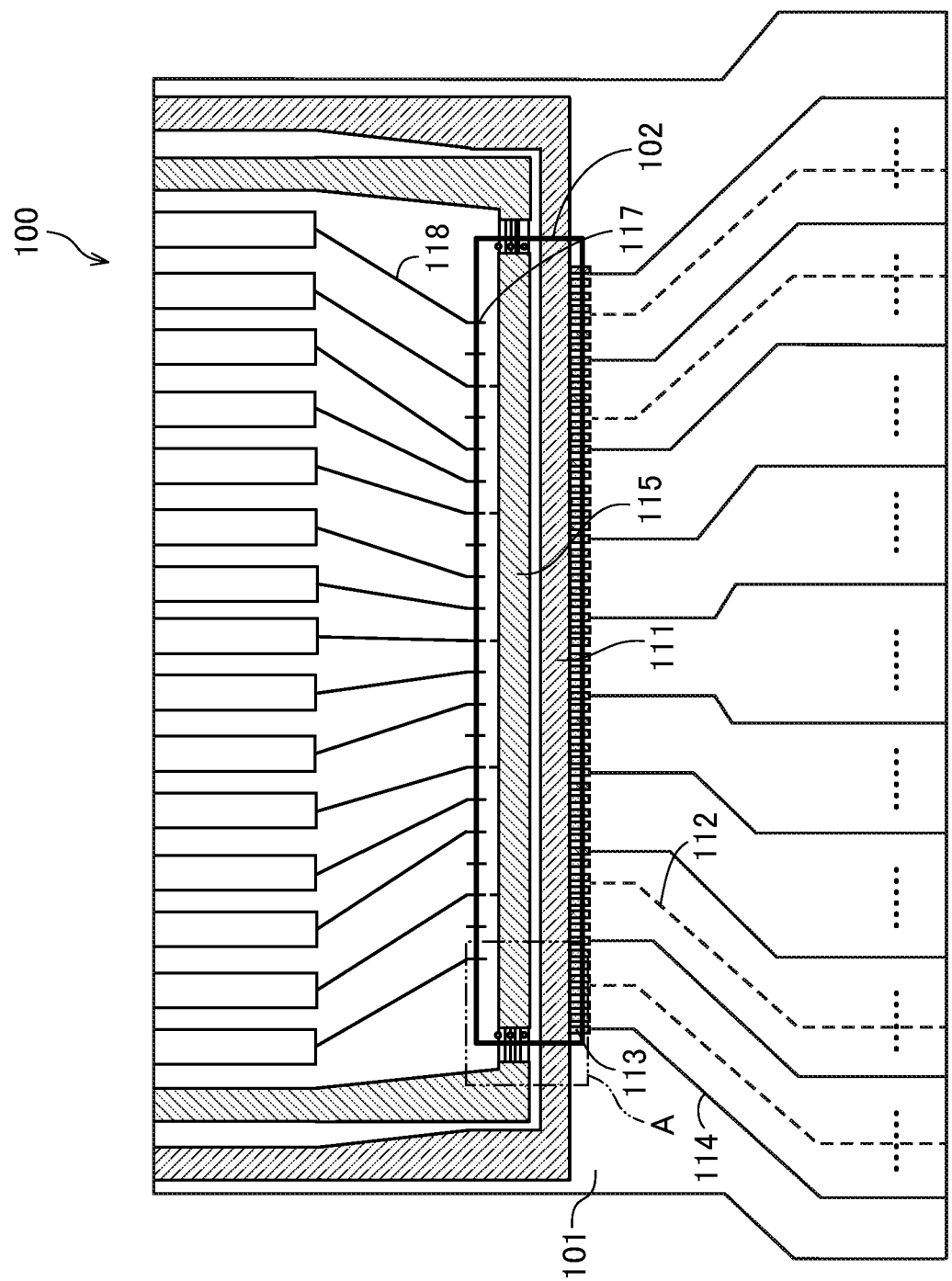
FIG. 1 is a plan explanatory view of an electronic device according to a first embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner and achieve similar results.

Although the embodiments are described with technical limitations with reference to the attached drawings, such description is not intended to limit the scope of the disclosure and all of the components or elements described in the embodiments of this disclosure are not necessarily indispensable.

Referring now to the drawings, embodiments of the present disclosure are described below. In the drawings for explaining the following embodiments, the same reference codes are allocated to elements (members or components) having the same function or shape and redundant descriptions thereof are omitted below.

Figure 2:
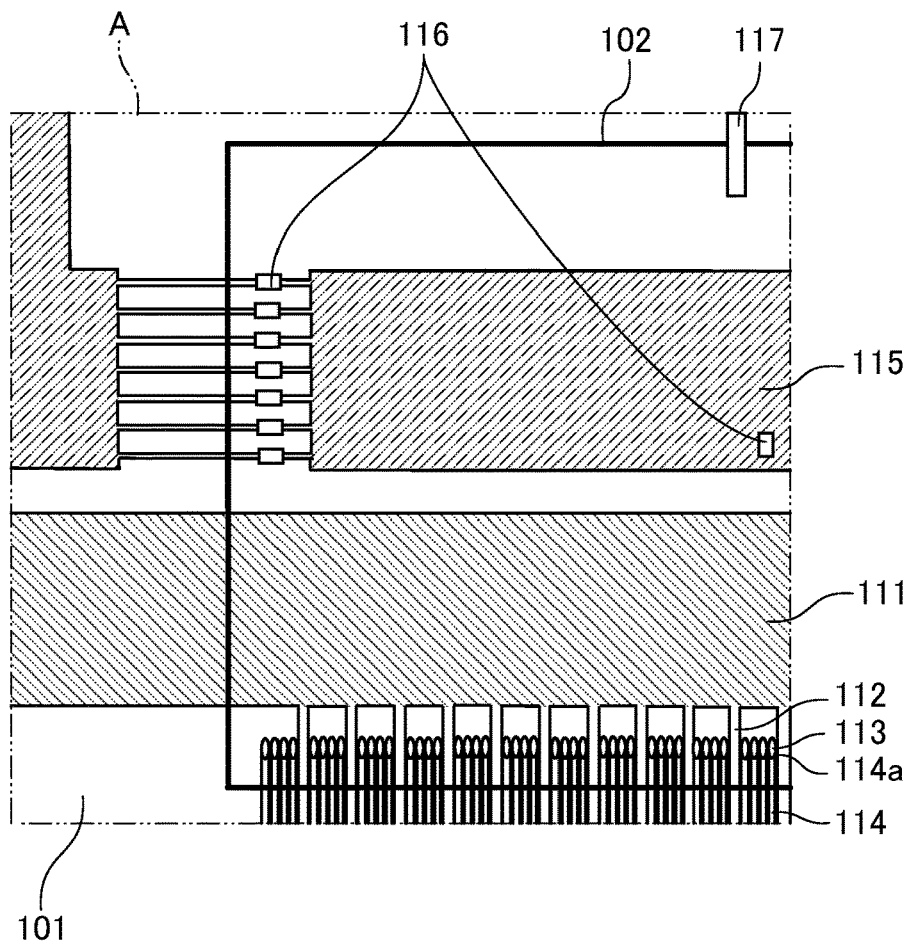
FIG. 2 is an enlarged explanatory view of a portion A illustrated in FIG. 1.
Figure 3:
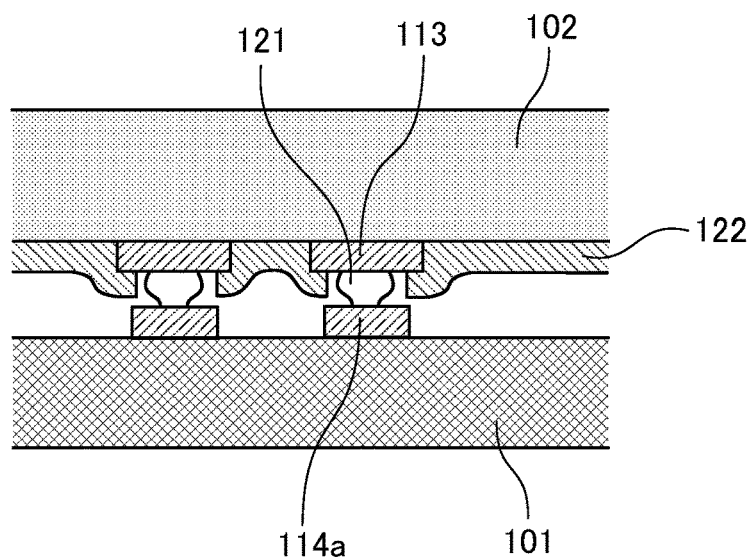
FIG. 3 is a cross-sectional explanatory view for explaining a state in which terminals of a switching element of the electronic device are electrically connected to pads on a wiring substrate.

The following is a description of embodiments of the present disclosure, with reference to the accompanying drawings. Referring to FIGS. 1 through 3, a first embodiment of the present disclosure is first described. FIG. 1 is a plan explanatory view of an electronic device according to the first embodiment. FIG. 2 is an enlarged explanatory view of a portion A illustrated in FIG. 1. FIG. 3 is a cross-sectional explanatory view for explaining a state in which terminals of a switching element of the electronic device are electrically connected to pads on a wiring substrate.

An electronic device 100 is formed by mounting a switching element 102 on a wiring substrate 101. The switching element 102 is a drive IC.

In the wiring substrate 101, a first common-electrode wiring 111 is disposed in the longitudinal direction of the switching element 102 in a region facing the switching element 102. A plurality of second common-electrode wirings 112 branch from a portion of the first common-electrode wiring 111 covered with the switching element 102. Here, the first common-electrode wiring 111 and the second common-electrode wirings 112 are electrode wirings that are electrically connected to a common electrode shared among a plurality of elements (a plurality of piezoelectric elements on the later described piezoelectric substrate, for example) disposed on a substrate or film to which the wiring substrate 101 is joined.

In the switching element 102, power-output terminals 113 of the plurality of elements are arranged in a row along a side of the switching element 102 and are connected to individual-electrode wirings 114. The power-output terminals 113 of the plurality of elements are arranged in such a manner that the interval between two adjacent power-output terminals 113 is wider than the interval between the other adjacent power-output terminals 113 every predetermined number (four in this example) of power-output terminals 113. The plurality of second common-electrode wirings 112 branching from the first common-electrode wiring 111 are disposed between the power-output terminals 113 of a plurality of elements. Here, the second common-electrode wirings 112 are disposed between the power-output terminals 113 of the drive elements arranged at a wider interval than the interval between the power-output terminals 113 of the other adjacent elements.

The second common-electrode wirings 112 extending from below the switching element 102 and a predetermined number of individual-electrode wirings 114 also extending from below the switching element 102 are alternately arranged and extend outward to be connected to the drive elements.

The individual-electrode wirings 114 are electrically connected to the individual electrodes of the drive elements, and the second common-electrode wirings 112 are electrically connected to the common electrode of the drive elements. Note that the common electrode of the drive elements may be an electrode that electrically connects second individual electrodes facing the individual electrodes of "n" elements.

On the wiring substrate 101, a common power-supply wiring 115 of the drive elements is disposed in a region under the switching element 102, and power-input terminals 116 of the drive elements are arranged at the end portions in the longitudinal direction of the switching element 102 and are connected to the common power-supply wiring 115 of the drive elements.

The common power-supply wiring 115 of the drive elements is connected to the power-output terminals 113 of the drive elements via switches inside the switching element 102. As illustrated in FIG. 3, the power-output terminals 113 of the drive elements are electrically connected to pads 114a of the individual-electrode wirings 114 by conductive bumps 121 (or anisotropic conductive films (ACFs), conductive wires, or the like), and are electrically connected to the individual electrodes of the drive elements via the individual-electrode wirings 114. The surface of the switching element 102 on which the conductive bumps 121 are provided is covered with an insulating film 122.

The first common-electrode wiring 111 is disposed between the common power-supply wiring 115 of the drive elements and the row of the power-output terminals 113 of the drive elements.

In a case where one second common-electrode wiring 112 is provided for each n-numbers of the individual-electrode wirings 114 (the power-output terminals 113 of the n-elements), the wiring width of the second common-electrode wiring 112 is preferably 1 to n-times the wiring width of the individual-electrode wirings 114.

When all the electronic components are driven, for example, the magnitude of the electric current flowing through the individual-electrode wirings 114 is approximately 1/n times the magnitude of the electric current flowing through the second common-electrode wirings 112. Even if the wiring width of the individual-electrode wirings 114 is reduced to a width that is 1/n times the wiring width of the second common-electrode wirings 112, the current capacity is maintained. In view of this, the wiring region can be narrowed.

The common power-supply wiring 115 and the first common-electrode wiring 111 of the drive elements preferably have wirings extending from the shorter sides of the switching element 102 to the outer side of a region on the wiring substrate 101 facing the switching element 102.

With this arrangement, when a filler such as an underfill is poured in after the switching element 102 is mounted, few voids remain, and the yield and the reliability become higher.

On the wiring substrate 101, control-signal wirings 118 are provided, and the control-signal wirings 118 are connected to control-signal input terminals 117 of the switching element 102. Turning on/off of the switches is controlled with control signals input to the control-signal input terminals 117.

In this manner, the plurality of second common-electrode wirings 112 branch from the portion of the first common-electrode wiring 111 covered with the switching element 102, and the second common-electrode wirings 112 are disposed between the power-output terminals 113 (or between the individual-electrode wirings 114) of the drive elements that are also a plurality of individual power-output terminals arranged in a row in the switching element 102.

With this arrangement, low-resistance wirings for the common electrode of the drive elements becomes unnecessary, and the electronic device can be made smaller in size. In other words, when the drive elements are piezoelectric elements, the common electrode of the piezoelectric elements has a high resistance, and therefore, the common electrode is normally reinforced with wirings such as the common-electrode wiring pattern so that the resistance is lowered. In the first embodiment, on the other hand, wirings like the common-electrode wiring pattern become unnecessary, and the electronic device can be made smaller in size.

Figure 4:
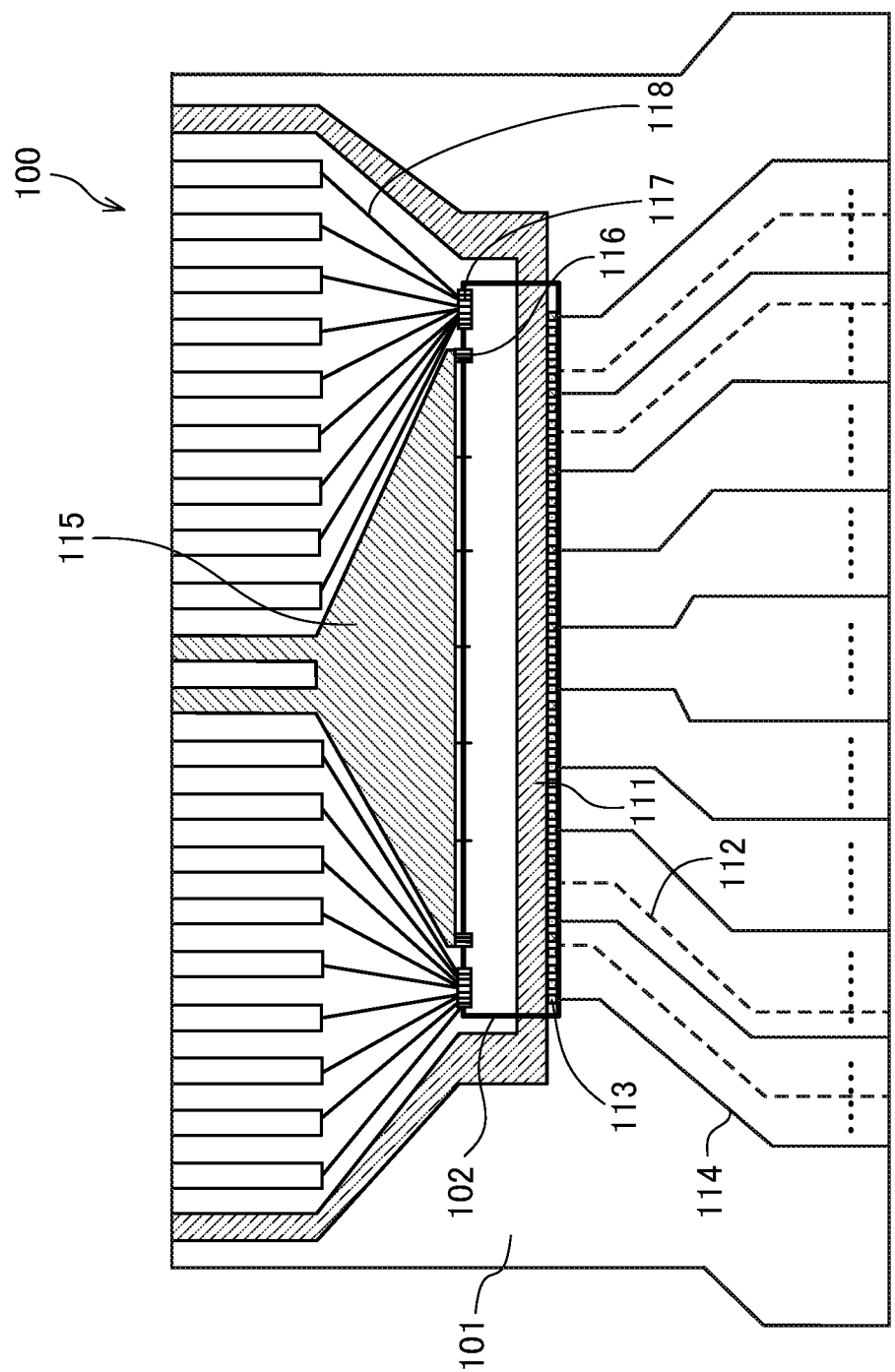
FIG. 4 is a plan explanatory view of an electronic device in a first example of a second embodiment of the present disclosure.
Figure 5:
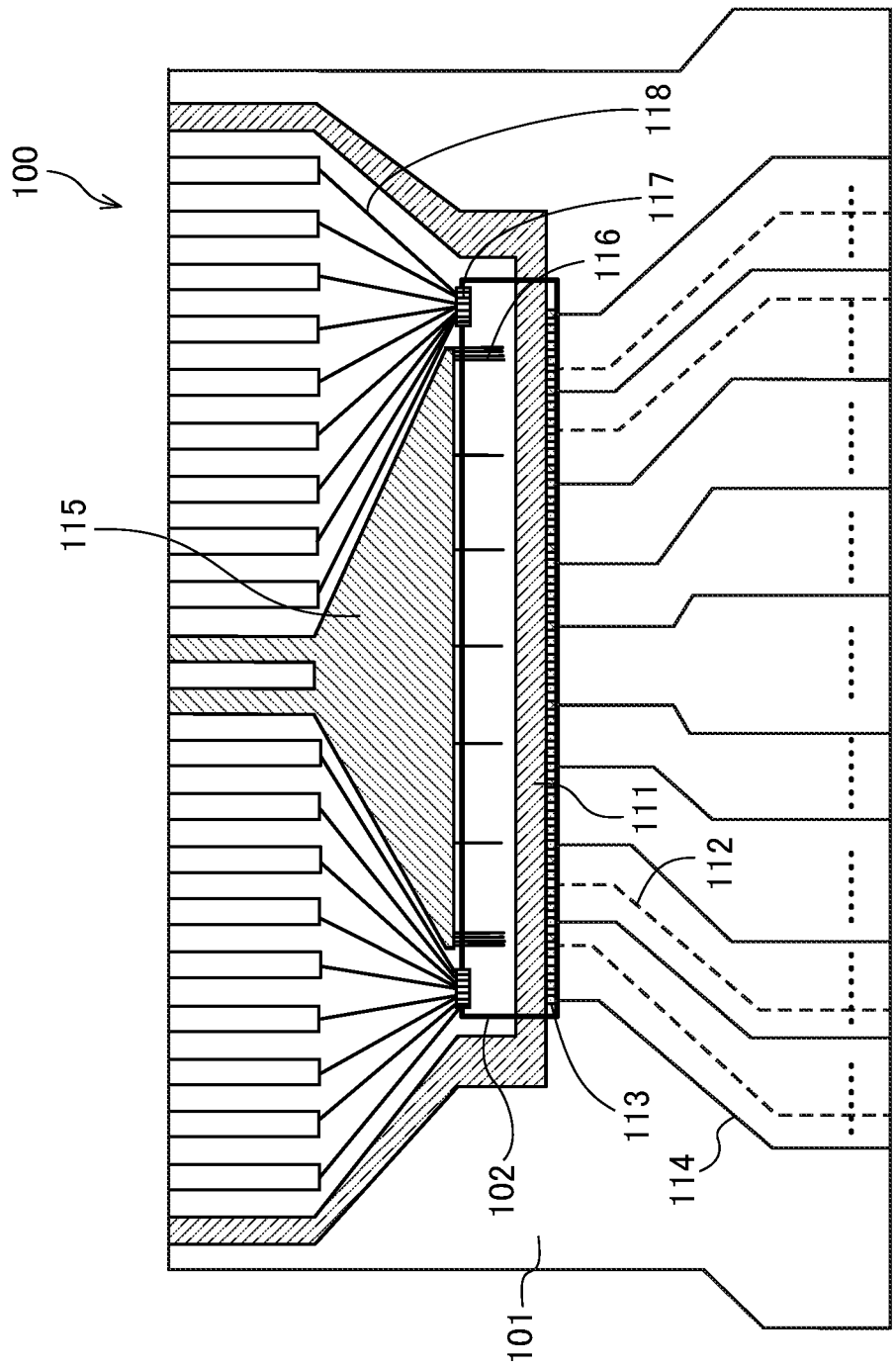
FIG. 5 is a plan explanatory view of an electronic device in a second example of the second embodiment.

Referring now to FIGS. 4 and 5, different examples of a second embodiment of the present disclosure are described. FIG. 4 is a plan explanatory view of an electronic device in a first example of the second embodiment. FIG. 5 is a plan explanatory view of an electronic device in a second example of the second embodiment.

In the first example illustrated in FIG. 4, the power-input terminals 116 of the drive elements are arranged along a longer side of the rectangular switching element 102, and the common power-supply wiring 115 of the drive elements is disposed on the outer side of the region on the wiring substrate 101 facing the switching element 102, faces the longer side of the switching element 102, and is electrically connected to the power-input terminals 116 of the drive elements.

Thus, the electronic device 100 includes a plurality of drive elements (piezoelectric elements 200, for example) connected to the plurality of individual-electrode wirings 114, respectively, a plurality of power-input terminals 116 disposed along one of longer sides of the switching element 102 having a rectangular shape, a common power-supply wiring 115 covering a part of an area (rectangle area in FIG. 4) outside the switching element 102 and being connected to the power-input terminal 116, and a plurality of control-signal input terminals 117 disposed at both ends of the one of the longer sides of the switching element 102.

The common power-supply wiring 115 supplies power to the plurality of drive elements (piezoelectric elements 200 in FIG. 10, for example) via the switching element 102 and the plurality of individual-electrode wirings 114.

In the second example illustrated in FIG. 5, in the switching element 102, the upper side in FIG. 5 is a low-voltage region, and the lower side is a high-voltage region. Therefore, the common power-supply wiring 115 is provided from the upper side, but the thin wirings leading to the power-input terminals 116 are extended to the lower side and are disposed closer to the lower side of the switching element 102.

With this arrangement, when a filler such as an underfill is poured in after the switching element 102 is mounted, fewer voids remain, and the yield and the reliability become higher than in the first embodiment.

Meanwhile, the control-signal input terminals 117 are disposed along a longer side of the switching element 102 and concentrate in regions close to the shorter sides (the end portions in the longitudinal direction). Note that the control-signal input terminals 117 can also be disposed along the shorter sides of the switching element 102.

With this arrangement, the common power-supply wiring 115 of the drive elements can be disposed to reach both ends of the switching element 102 in the longitudinal direction. Accordingly, the power supply wiring resistance difference between the power-output terminals 113 of the drive elements becomes smaller, and the drive waveform voltage difference can be made smaller. For example, when the drive elements are pressure generating elements of a liquid discharge head, generation of a droplet velocity difference and a droplet weight difference can be reduced or prevented.

Figure 6:
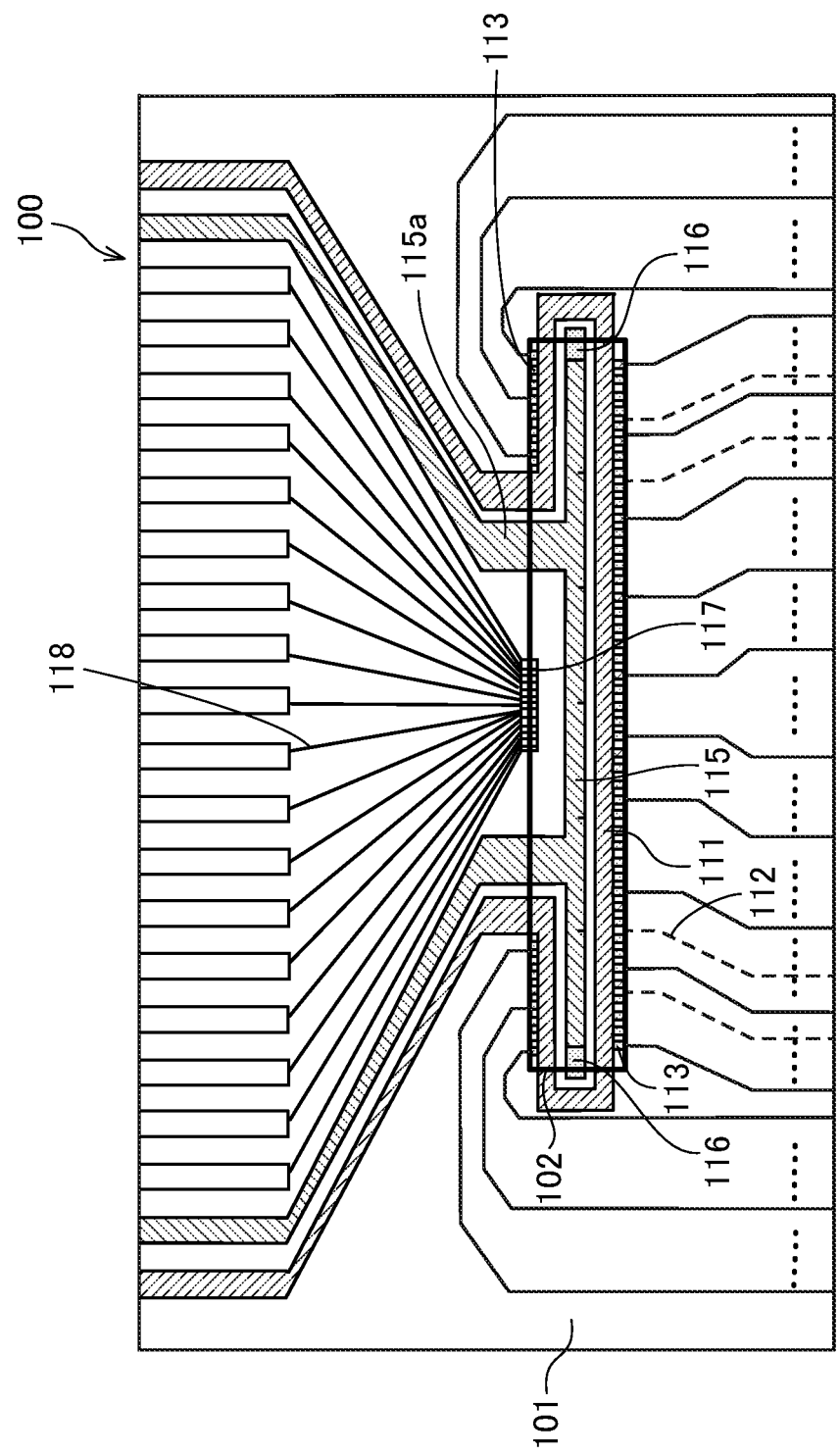
FIG. 6 is a plan explanatory view of an electronic device according to a third embodiment of the present disclosure.

Referring now to FIG. 6, a third embodiment of the present disclosure is described. FIG. 6 is a plan explanatory view of an electronic device according to the third embodiment.

In the third embodiment, the common power-supply wiring 115 is disposed to extend in the longitudinal direction of the switching element 102, in a region on the wiring substrate 101 facing the switching element 102.

The first common-electrode wiring 111 is disposed in two rows that sandwiches the common power-supply wiring 115 of the drive elements, in a region on the wiring substrate 101 facing the switching element 102. The two rows are connected to each other at the shorter sides of the switching element 102.

Thus, the electronic device 100 includes a plurality of drive elements (piezoelectric elements 200, for example) connected to the plurality of individual-electrode wirings 114, respectively, a plurality of power-output terminals 113 disposed at both ends of each of longer sides of the switching element 102 having a rectangular shape, two rows of first common-electrode wirings 111 disposed in a region facing the switching element 102, the two rows of first common-electrode wirings 111 being connected to each other at regions outside each of shorter sides of the switching element 102 in longitudinal direction of the switching element 102, and a common power-supply wiring 115 disposed in a region interposed between the two rows of first common-electrode wiring 111, the common power-supply wiring 115 extending in a longitudinal direction of the switching element 102.

The common power-supply wiring 115 and the first common-electrode wiring 111 of the drive elements have wirings extending from the longer sides of the switching element 102 to the outer side of the region on the wiring substrate 101 facing the switching element 102.

Extension wirings 115a of the common power-supply wiring 115 of the drive elements are disposed as close as possible to both shorter sides of the switching element 102, and the first common-electrode wiring 111 is disposed along the outline of the extension wirings 115a of the common power-supply wiring 115 of the drive elements.

The power-output terminals 113 of the drive elements are arranged not only along one longer side of the switching element 102 but also along the other longer side.

With this arrangement, a higher degree of freedom is allowed in designing the size of the switching element 102 both in the longitudinal direction and in the lateral direction, and the number of products to be obtained from one wafer becomes larger. As a result, the cost of the switching element 102 can be lowered.

Figure 7:
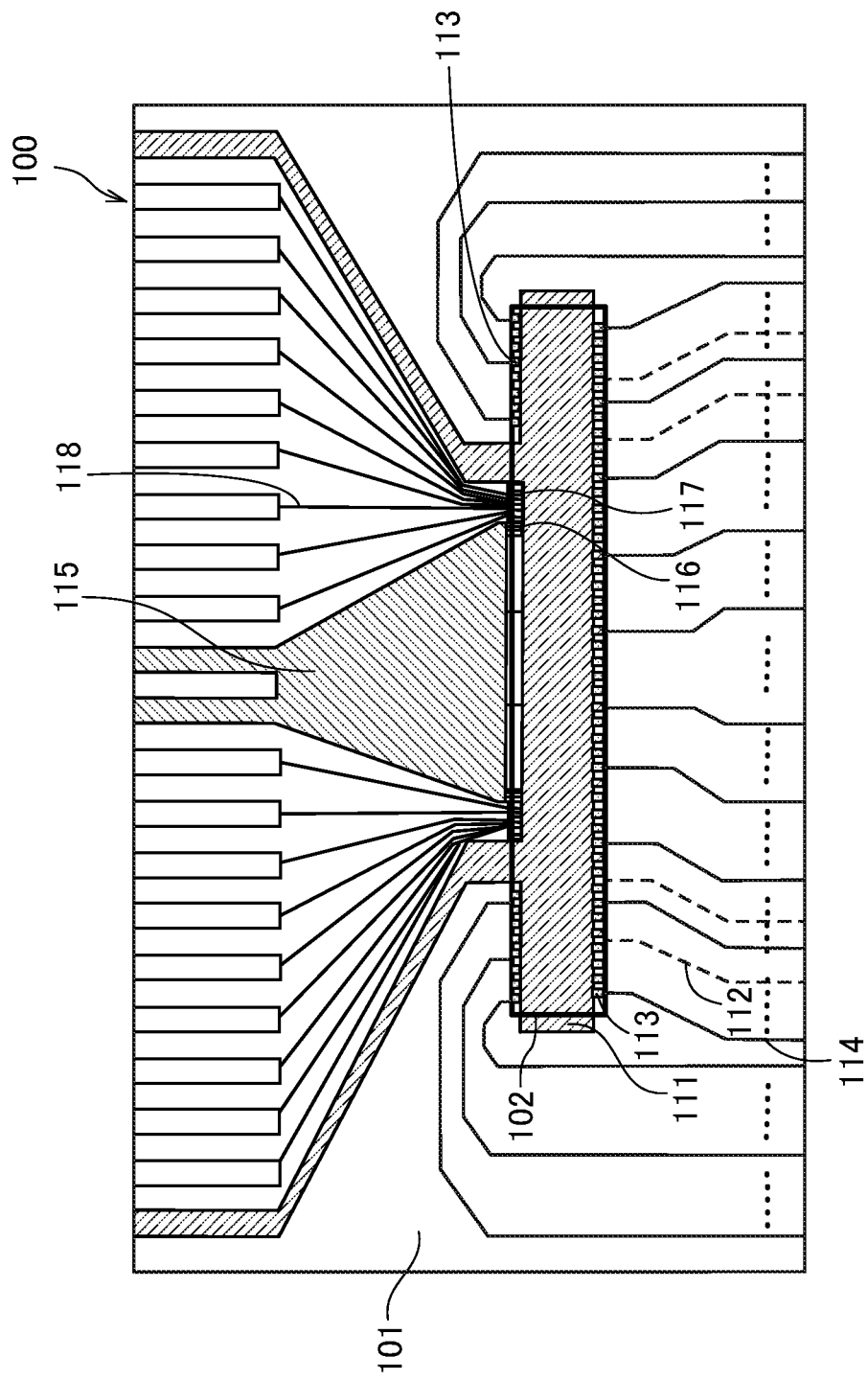
FIG. 7 is a plan explanatory view of an electronic device according to a fourth embodiment of the present disclosure.
Figure 8:
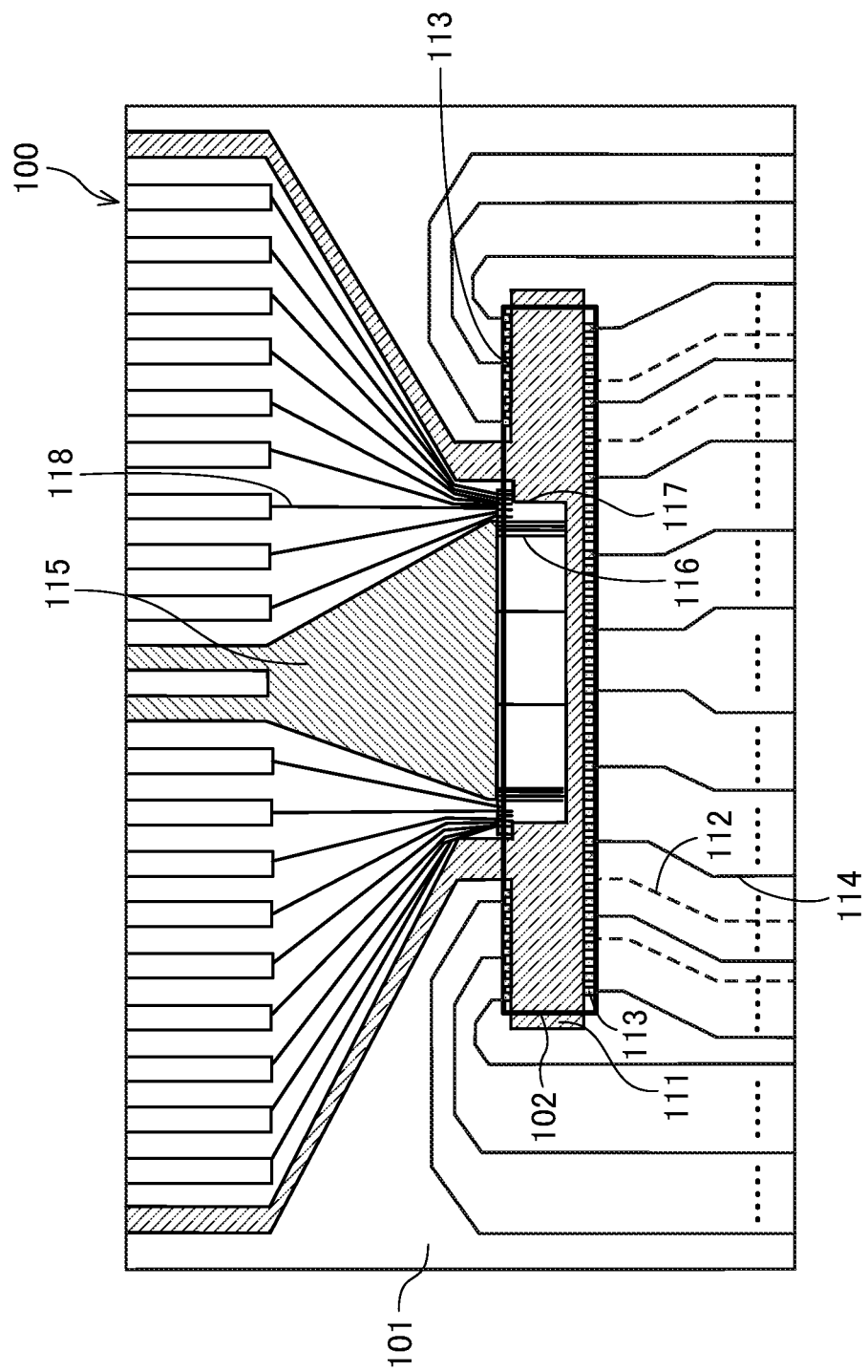
FIG. 8 is a plan explanatory view of an electronic device in a second example of the fourth embodiment.

Referring now to FIGS. 7 and 8, a fourth embodiment of the present disclosure is described. FIG. 7 is a plan explanatory view of an electronic device in a first example of the fourth embodiment. FIG. 8 is a plan explanatory view of an electronic device in a second example of the fourth embodiment.

The first example illustrated in FIG. 7 differs from the third embodiment in that the first common-electrode wiring 111 is formed in one row in a region on the wiring substrate 101 facing the switching element 102, the power-input terminals 116 of the drive elements are arranged along a longer side of the switching element 102, and the common power-supply wiring 115 of the drive elements is disposed on the outer side of the region on the wiring substrate 101 facing the switching element 102, faces the longer side of the switching element 102, and is electrically connected to the power-input terminals 116 of the drive elements.

The first common-electrode wiring 111 of the drive elements has wirings extending from the longer sides of the switching element 102 to the outer side of the region on the wiring substrate 101 facing the switching element 102.

In the second example illustrated in FIG. 8, in the switching element 102, the upper side in FIG. 8 is a low-voltage region, and the lower side is a high-voltage region. Therefore, the common power-supply wiring 115 is provided from the upper side, but the thin wirings leading to the power-input terminals 116 are extended to the lower side and are disposed closer to the lower side of the switching element 102, as in the second example of the second embodiment.

With this arrangement, when a filler such as an underfill is poured in after the switching element 102 is mounted, fewer voids remain, and the yield and the reliability become higher than in the third embodiment.

Figure 9:
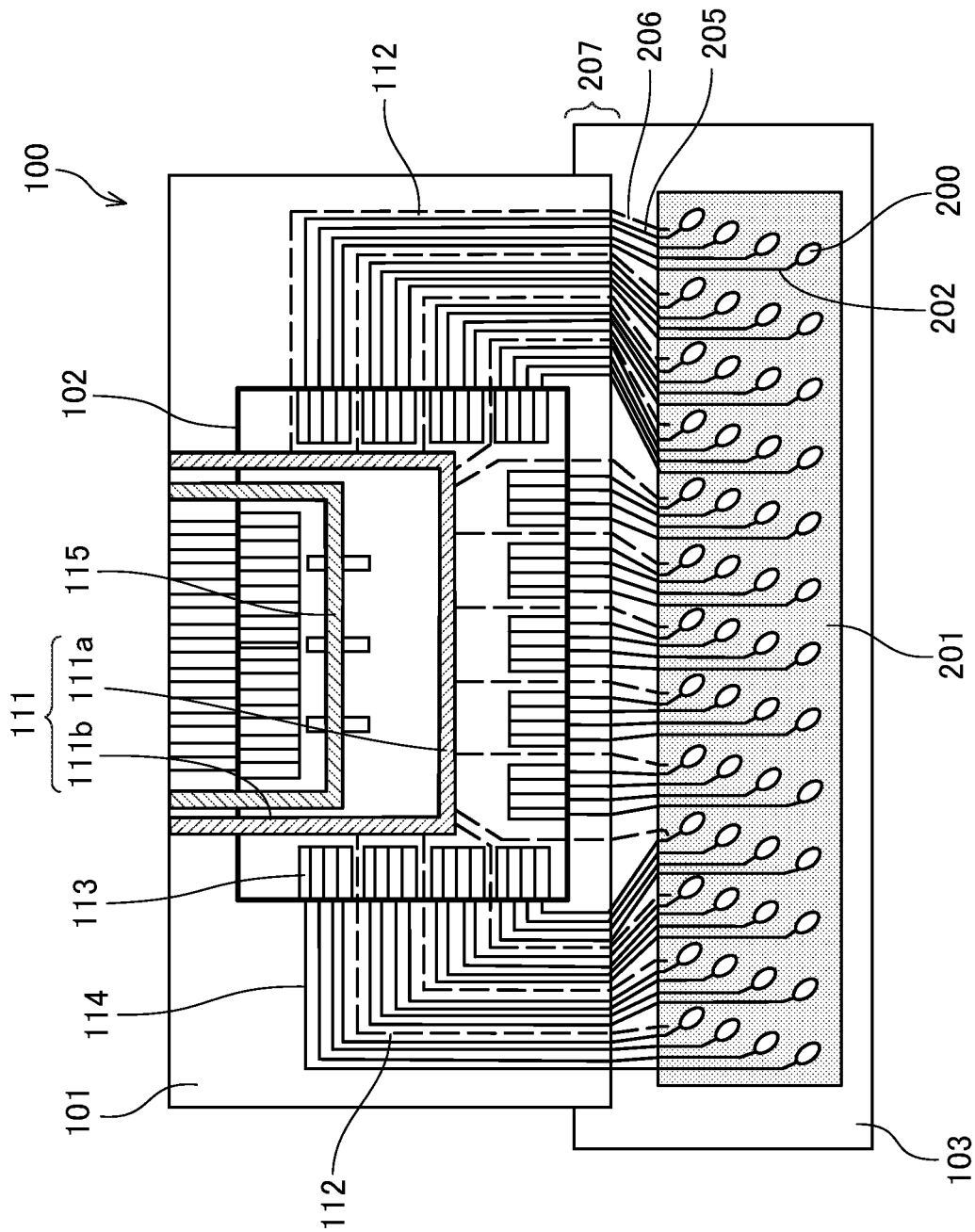
FIG. 9 is a plan explanatory view of an electronic device in a first example of a fifth embodiment of the present disclosure.

Referring now to FIG. 9, a fifth embodiment of the present disclosure is described. FIG. 9 is a plan explanatory view of an electronic device according to the fifth embodiment.

The electronic device 100 is formed by connecting the wiring substrate 101 including the switching element 102, and a piezoelectric substrate 103 as a drive element substrate.

The first common-electrode wiring 111 on the wiring substrate 101 includes a wiring portion 111a extending in a direction parallel to the longer sides of the switching element 102 and wiring portions 111b extending in a direction parallel to the shorter sides.

The second common-electrode wirings 112 branch from both the wiring portion 111a and the wiring portions 111b of the first common-electrode wiring 111. That is, there are not only individual-electrode wirings 114 and second common-electrode wirings 112 extending from one longer side of the switching element 102, but also individual-electrode wirings 114 and second common-electrode wirings 112 extending from the shorter sides perpendicular to the longer sides of the switching element 102.

At both ends of the switching element 102 in the longitudinal direction, both ends of the wiring portion 111a of the first common-electrode wiring 111 are bent 90 degrees, to form the wiring portions 111b. The wiring portions 111b extend from the longer side on the opposite side from the longer side from which the individual-electrode wirings 114 and the second common-electrode wirings 112 extend.

The common power-supply wiring 115 is also bent 90 degrees at both ends of the switching element 102 in the longitudinal direction and extends from the longer side from which the first common-electrode wiring 111 extends.

With this arrangement, a higher degree of freedom is allowed in designing the size of the switching element 102 both in the longitudinal direction and in the lateral direction, and the number of products to be obtained from one wafer becomes larger. As a result, the cost of the switching element 102 can be lowered.

As described above, the wiring substrate 101 and the piezoelectric substrate 103 as a drive element substrate are connected in a region 207, to form the electronic device 100 according to the present disclosure. Note that the wiring substrate 101 is formed with a flexible wiring substrate.

In the piezoelectric substrate 103, piezoelectric elements 200 are arranged, and a common electrode 201 (common-electrode wiring) shared among the plurality of piezoelectric elements 200 are arranged. The sheet resistance of the common electrode 201 is higher than the sheet resistance of the first common-electrode wiring 111. The piezoelectric elements 200 are one of examples of the drive elements.

On the wiring substrate 101, a predetermined number of individual-electrode wirings 114 and second common-electrode wirings 112 are alternately arranged and extended to the wiring connecting portion.

On the piezoelectric substrate 103, second individual-electrode wirings 205 extended from individual electrodes 202 of the piezoelectric elements 200 to the wire line connecting portion, and third common-electrode wirings 206 extended from the common electrode 201 of the piezoelectric elements 200 to the wiring connecting portion are alternately arranged.

The individual-electrode wirings 114 and the second individual-electrode wirings 205, and the second common-electrode wirings 112 and the third common-electrode wirings 206 are electrically connected at the wiring connecting portion.

With this arrangement, even if the sheet resistance of the common electrode 201 on the piezoelectric substrate 103 is high, it is possible to reduce or prevent generation of a drive waveform voltage difference due to the positions of the piezoelectric elements 200.

As the sheet resistance can be high, there is no longer the need to provide any common-electrode wiring extending across the common electrode on the piezoelectric substrate 103 (only a common electrode with a high sheet resistance is normally required on the piezoelectric substrate 103), and accordingly, the piezoelectric substrate 103 can be made smaller in size and lower in cost.

Further, in a case where generation of a temperature distribution near the drive elements (the piezoelectric substrate 103) due to common-electrode wirings is reduced, and the piezoelectric elements 200 are pressure generating elements of a liquid discharge head, the discharge characteristics of liquid droplets can be prevented from varying. This enables a reduction in the thickness of the common electrode 201 on the piezoelectric substrate 103 or allows the use of a material having a high resistivity.

In this case, a small temperature distribution due to common-electrode wirings is generated at the first common-electrode wiring 111 under the switching element (the temperature distribution is small, because the wiring resistance is low), but the temperature distribution is prevented at the drive element portions.

Note that the wiring substrate 101 may have the structure of any wiring substrate 101 described in the first through fourth embodiments. Further, the drive element substrate is not necessarily a piezoelectric substrate.

In the present disclosure, the first common-electrode wiring 111 is supplied with power (an upper power supply) from both ends of the wiring. The second common-electrode wirings 112 are arranged in a direction from an end of the first common-electrode wiring 111 toward the central portion in the following manner.

One second common-electrode wiring 112 is provided for a distance at which the resistance value of the first common-electrode wiring 111 becomes 0.9Ω (or for twelve individual-electrode wirings 114), one second common-electrode wiring 112 is provided for a distance at which the resistance value of the first common-electrode wiring 111 becomes 0.6Ω (or for eight individual-electrode wirings 114), and one second common-electrode wiring 112 is provided for a distance at which the resistance value of the first common-electrode wiring 111 becomes 0.3Ω (or for four individual-electrode wirings 114).

That is, in the path from the common power-supply wiring 115 to the internal wirings of the switching element 102 to the individual-electrode wirings 114 to the piezoelectric elements 200 to the common electrode 201 (common-electrode wiring) to the second common-electrode wirings 112 to the first common-electrode wiring 111, a larger number of second common-electrode wirings 112 for the resistance value of the first common-electrode wiring 111 (or the number of the individual-electrode wirings 114) are disposed at portions further from the upper power supply of the first common-electrode wiring 111 than at portions closer to the power supply, so that the piezoelectric elements 200 at the respective positions in the drive element rows have similar voltage drops.

With this arrangement, in a case where the second common-electrode wirings 112 are arranged at regular intervals, the wiring resistance value to the drive elements arranged from the end portions of the first common-electrode wiring 111 having a relatively small voltage drop is increased, so that the voltage can be dropped by almost the same amount as the voltage drops of the drive elements arranged from the central portion of the first common-electrode wiring 111 having a relatively large voltage drop. Alternatively, in a case where the second common-electrode wirings 112 are arranged at regular intervals, the wiring resistance value to the drive elements arranged from the central portions of the first common-electrode wiring 111 having a relatively large voltage drop is reduced, so that the voltage drops of the drive elements arranged from the central portion of the first common-electrode wiring 111 can be reduced.

That is, the resistance value in the path extending from the common power-supply wiring to the individual-electrode wirings to the drive elements to the common electrode (wiring) to the second common-electrode wirings to the first common-electrode wiring can be adjusted, so that the drive elements at the central portion of a drive element row have the same voltage drops as the voltage drops in the drive elements at the end portions. In this case, the current value varies with each region of the common wirings, and therefore, the product of current×resistance is made constant.

In this manner, it is possible to reduce or prevent generation of a drive waveform voltage difference due to the positions of the drive elements.

Figure 10:
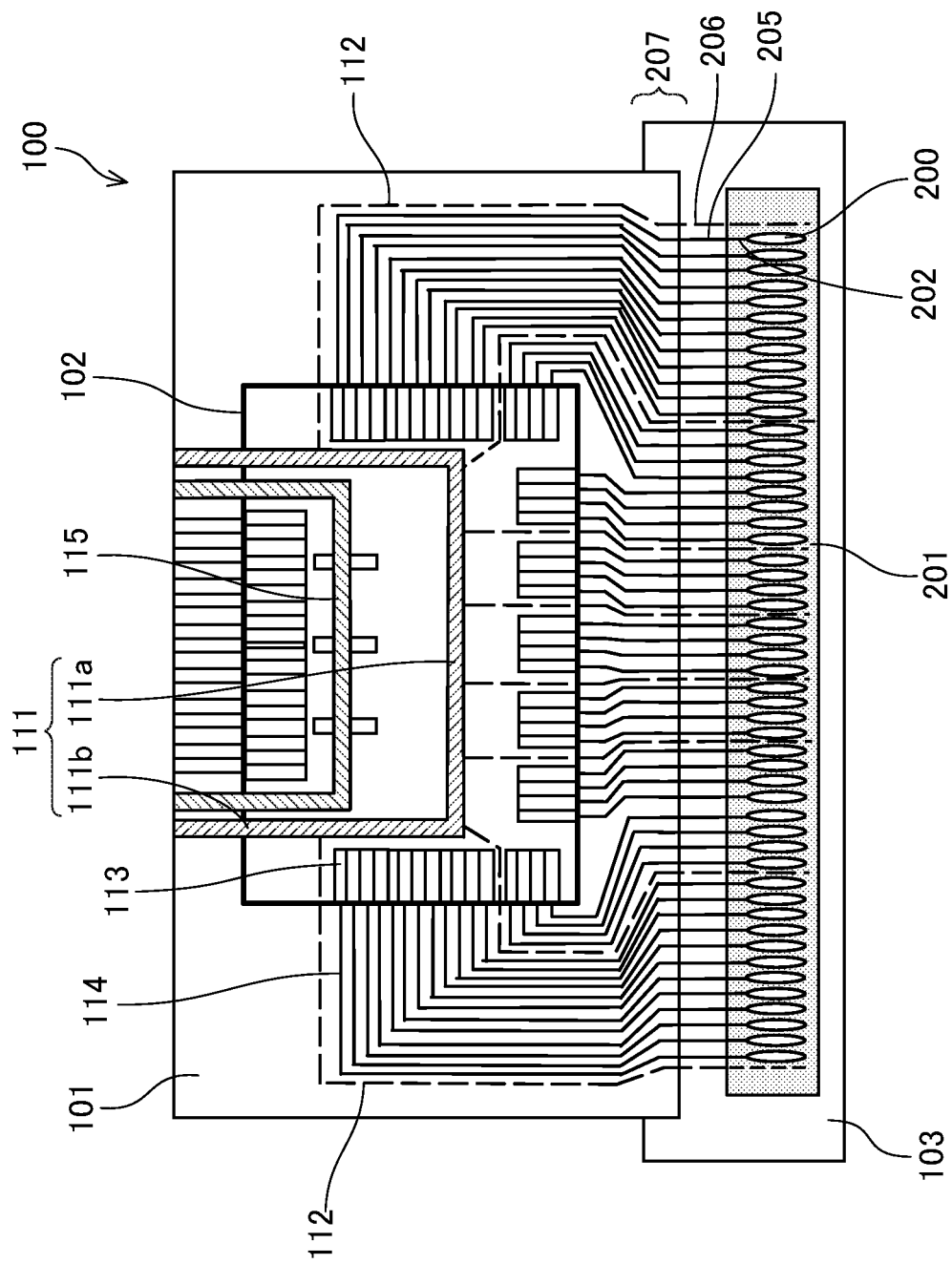
FIG. 10 is a plan explanatory view of an electronic device according to a sixth embodiment of the present disclosure.

Referring now to FIG. 10, a sixth embodiment of the present disclosure is described. FIG. 10 is a plan explanatory view of an electronic device according to the sixth embodiment.

In the sixth embodiment, the electronic device 100 is also formed by connecting the wiring substrate 101 including the switching element 102, and the piezoelectric substrate 103 as a drive element substrate.

In the direction from an end portion of the piezoelectric substrate 103 toward the central portion with respect to the array direction of the second individual-electrode wirings 205 and the third common-electrode wirings 206, one third common-electrode wiring 206 is provided for twelve second individual-electrode wirings 205, one third common-electrode wiring 206 is provided for eight second individual-electrode wirings 205, and one third common-electrode wiring 206 is provided for four second individual-electrode wirings 205.

That is, a larger number of third common-electrode wirings 206 with respect to the number of second individual-electrode wirings 205 (per unit area) are provided at the central portion of the piezoelectric substrate 103 than at the end portions of the piezoelectric substrate 103.

Accordingly, in the drive element row, the number of the second common-electrode wirings 112 at the portion in which temperature does not easily drop (or cooling is not easy, or heat is not easily released) is larger than the number of the second common-electrode wirings 112 at the portion in which temperature easily drops (or cooling is easy, or heat is easily released).

With this arrangement, the temperature distribution in the piezoelectric substrate 103 can be made uniform.

In other words, when the rows of the piezoelectric elements 200, which are a plurality of element rows arranged on the piezoelectric substrate 103, are uniformly driven, the temperature of the piezoelectric substrate 103 tends to become lower at the shorter sides (the end portions in the longitudinal direction) than at the central portion in the longitudinal direction.

Thus, the electronic device 100 includes a plurality of drive elements (piezoelectric elements 200, for example) connected to the plurality of individual-electrode wirings 114, respectively. A number of the second common-electrode wirings 112 per unit area or a number of the plurality of (individual) power-output terminals 113 at a first portion (central portion of the piezoelectric substrate 103), in which temperature of the plurality of drive elements increases during driving of the plurality of drive elements, is larger than a number of the second common-electrode wirings 112 per unit area or a number of the plurality of (individual) power-output terminals 113 at a second portion (each ends of the piezoelectric substrate 103), in which temperature of the plurality of drive elements becomes lower than the first portion during driving of the plurality of drive elements.

In view of this, in the above arrangement, a smaller number of third common-electrode wirings 206 are disposed at the shorter sides of the piezoelectric substrate 103. Accordingly, a larger amount of electric current flows in the third common-electrode wirings 206 disposed at the shorter sides than the larger number of the third common-electrode wirings 206 disposed at the central portion of the piezoelectric substrate 103, and the amount of generated heat increases with the square of the electric current (the amount of generated heat per unit area increases, even though the number of third common-electrode wirings 206 per unit area is small). Thus, the temperature distribution in the piezoelectric substrate 103 is made uniform.

Figure 11:
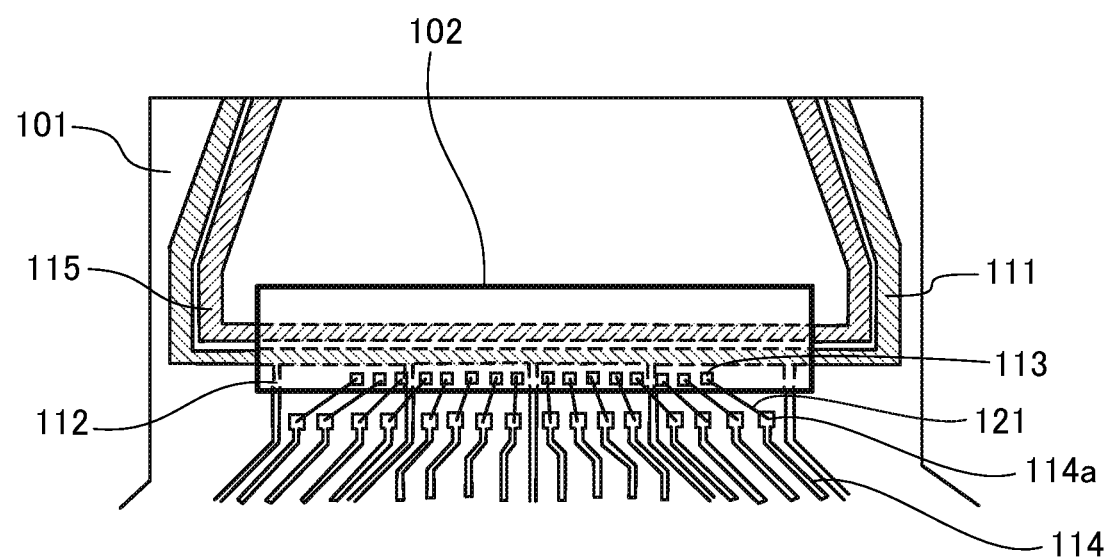
FIG. 11 is a plan explanatory view of an electronic device according to a seventh embodiment of the present disclosure.

Referring now to FIG. 11, a seventh embodiment of the present disclosure is described. FIG. 11 is a plan explanatory view of an electronic device according to the seventh embodiment.

In the seventh embodiment, the power-output terminals 113 are on the upper surface of the switching element 102 (the surface not facing the wiring substrate 101) and are electrically connected to the pads 114a on the wiring side with wires by a technique such as wire bonding, and the pads 114a on the side of the wiring substrate 101 allow the second common-electrode wirings 112 to extend in between, by leaving some gaps.

In this case, the power-output terminals 113 can three-dimensionally intersect with the second common-electrode wirings 112, and accordingly, the power-output terminals 113 are arranged at regular intervals.

With this arrangement, the length of the terminal row of the power-output terminals 113 can be reduced, and accordingly, a higher degree of freedom is allowed in designing the switching element 102.

In the above embodiments, a dummy terminal may be provided between individual power-output terminals 113 arranged at a wider interval in the switching element 102, and a second common-electrode wiring 112 can be connected to the dummy terminal. The individual power-output terminals 113 are arranged at a wider interval in that particular portion, but the terminal intervals can be made uniform as the dummy terminal is inserted. As the terminals are uniformly arranged, the pressure becomes constant, and the switching element 102 can be easily mounted on the substrate.

Figure 12:
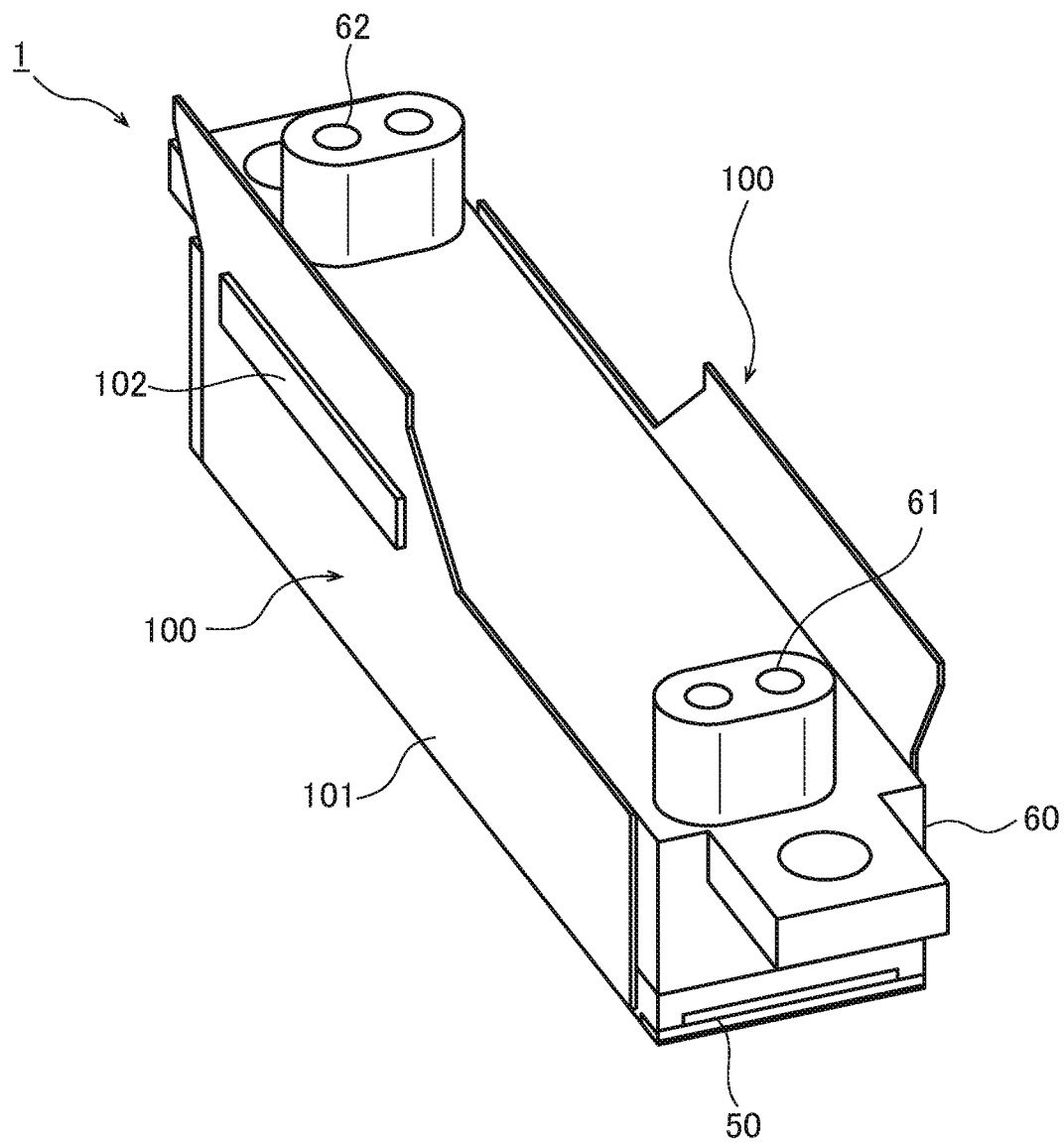
FIG. 12 is a perspective explanatory view of an example of a liquid discharge head according to an embodiment of the present disclosure.
Figure 13:
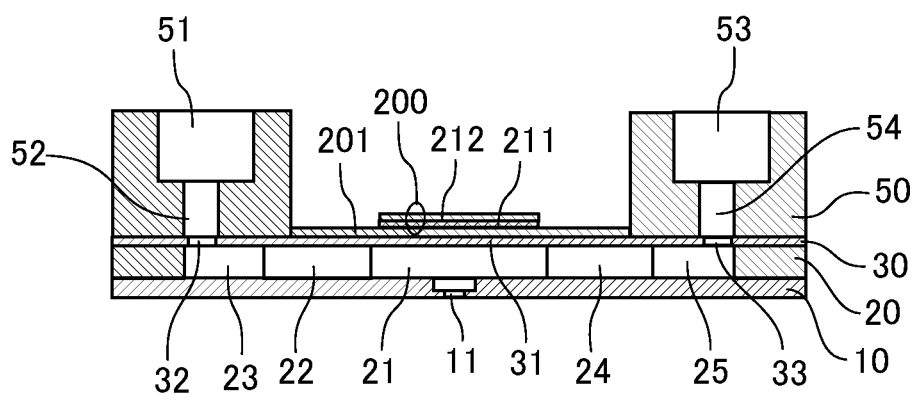
FIG. 13 is a cross-sectional explanatory view of the head.
Figure 14:
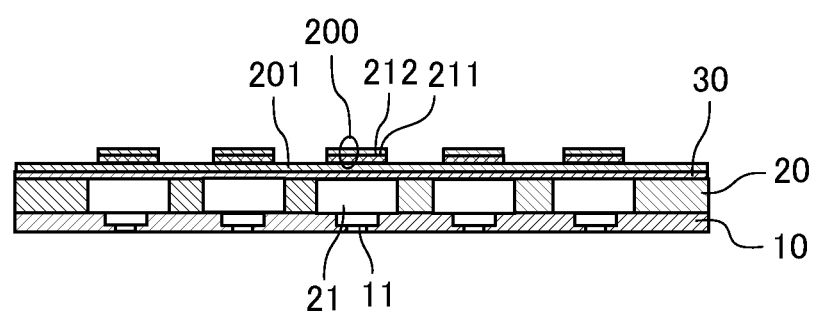
FIG. 14 is a cross-sectional explanatory view of the head, taken along a line perpendicular to FIG. 13.

Referring now to FIGS. 12 through 14, an example of a liquid discharge head according to an embodiment of the present disclosure is described. FIG. 12 is a perspective explanatory view of the exterior of the liquid discharge head. FIG. 13 is a cross-sectional explanatory view of the liquid discharge head. FIG. 14 is a cross-sectional explanatory view of the liquid discharge head, taken along a line perpendicular to FIG. 13.

The liquid discharge head 1 includes a nozzle plate 10, a channel plate 20, a diaphragm 30, piezoelectric elements 200 as the drive elements, a common channel member 50, a frame member 60, and an electronic device 100 according to an embodiment of the present disclosure.

In the nozzle plate 10, a plurality of nozzles 11 for discharging liquid are formed.

The channel plate 20, together with the nozzle plate 10 and the diaphragm 30, forms individual chambers 21 with which the nozzles 11 communicate, a supply-side fluid resistance portion 22 that communicates with the individual chambers 21, and a supply-side individual channel 23 that communicates with the supply-side fluid resistance portion 22.

The supply-side individual channel 23 communicates with a supply-side common channel 52 formed with the common channel member 50 through an opening 32 of the diaphragm 30 and a supply port 51 of the common channel member 50.

The diaphragm 30 forms a deformable vibrating region 31 that forms part of the wall surfaces of the individual chambers 21. Piezoelectric elements 200 are integrally formed on the surface on the opposite side of the vibrating region 31 of the diaphragm 30 from the individual chambers 21.

Each piezoelectric element 200 is formed by sequentially stacking the common electrode 201, a piezoelectric layer (a piezoelectric body) 211, and an individual electrode 212 in this manner from the side of the vibrating region 31.

The second common-electrode wirings 112 of the electronic device 100 including the wiring substrate 101 on which the switching element 102 serving as a driver Integrated Circuit (IC) is mounted are connected to the common electrode 201 via the third common-electrode wirings 206, and the individual-electrode wirings 114 are connected to the individual electrodes 212 via the second individual-electrode wirings 205. In the liquid discharge head 1, the diaphragm 30, on which the piezoelectric elements 200 are integrally formed, is equivalent to the above described piezoelectric substrate 103.

The channel plate 20, together with the nozzle plate 10 and the diaphragm 30, also forms a collecting-side fluid resistance portion 24 that communicates with the individual chambers 21, and a collecting-side individual channel 25 that communicates with the collecting-side fluid resistance portion 24.

The collecting-side individual channel 25 communicates with a collecting-side common channel 54 formed with the common channel member 50 through an opening 33 of the diaphragm 30 and a collecting port 53 of the common channel member 50.

The supply-side common channel 52 communicates with a supply port 61 of the frame member 60, the collecting-side common channel 54 communicates with a collection port 62 of the frame member 60, and the supply port 61 and the collection port 62 are connected to a liquid circulation apparatus.

In this head 1, when a drive voltage is applied to the piezoelectric elements 200, the vibrating region 31 is deformed to pressurize the liquid in the individual chambers 21. As a result, the liquid is discharged from the nozzles 11.

Meanwhile, the liquid not discharged from the nozzles 11, or the liquid that is supplied from the supply-side common channel 52 when any liquid is not being discharged from the nozzles 11 is collected into the collecting-side common channel 54 and is supplied back to the supply-side common channel 52 through the external liquid circulation apparatus.

Figure 15:
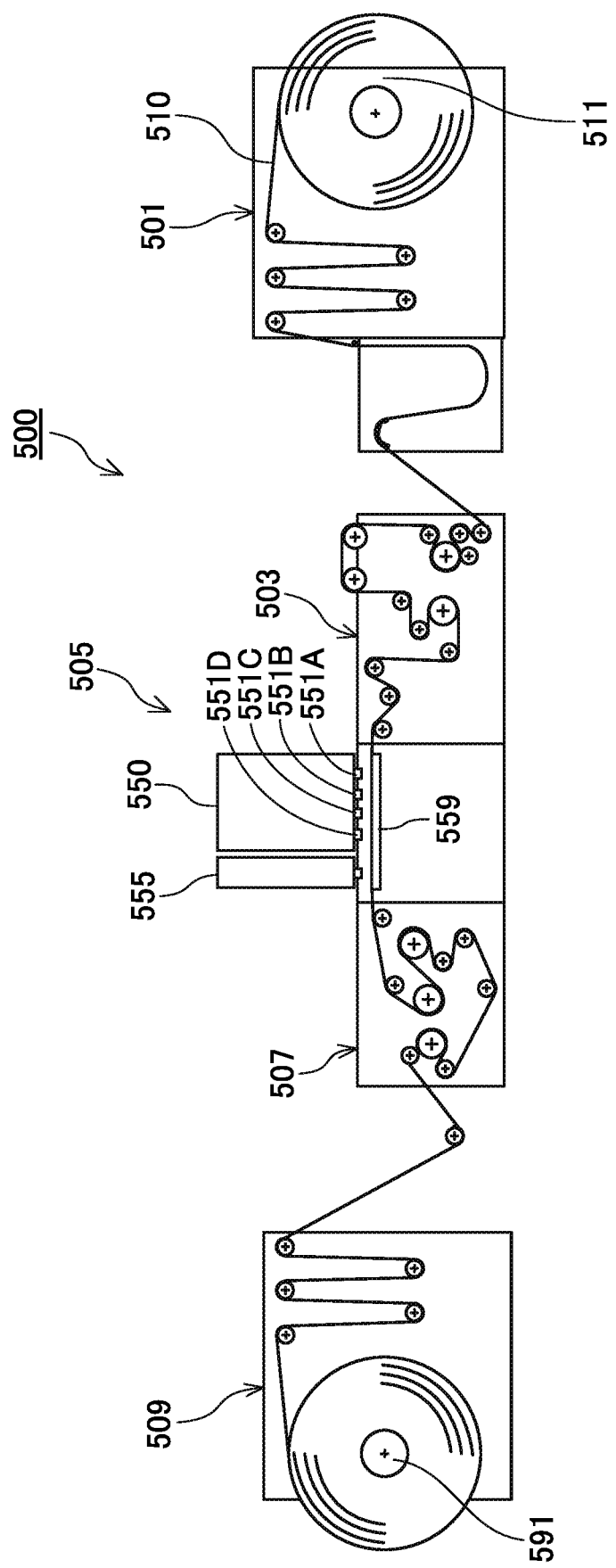
FIG. 15 is a schematic explanatory view of an example of a liquid discharge apparatus according to an embodiment of the present disclosure.
Figure 16:
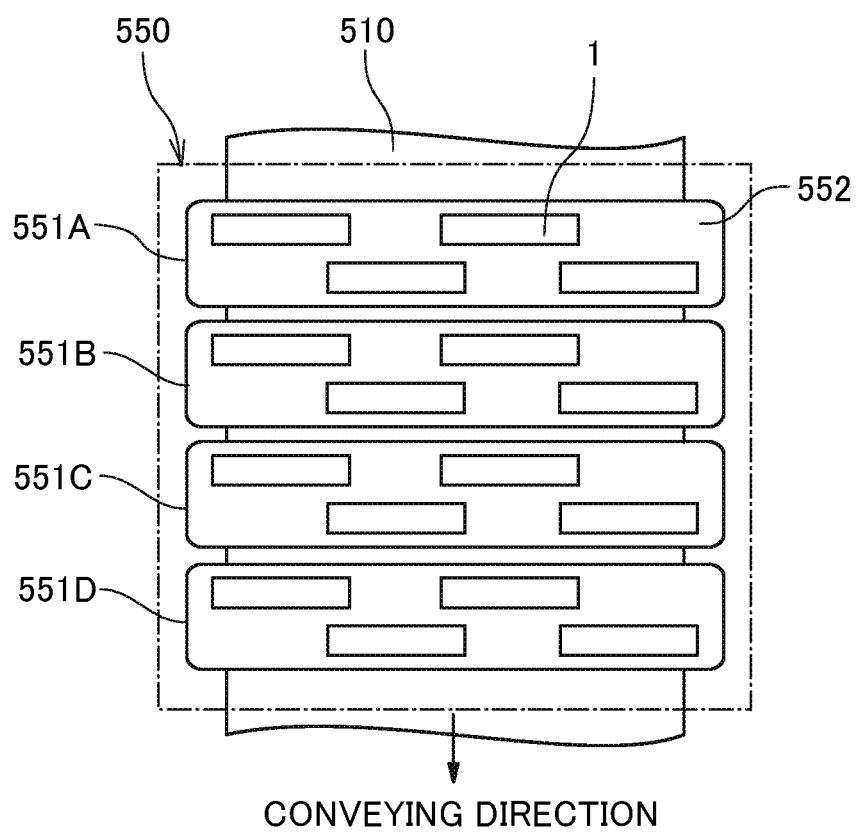
FIG. 16 is a plan explanatory view of an example of the head unit of the liquid discharge apparatus.

Referring now to FIGS. 15 and 16, an example of a liquid discharge apparatus according to an embodiment of the present disclosure is described. FIG. 15 is a schematic explanatory view of the liquid discharge apparatus. FIG. 16 is a plan explanatory view of an example of the head unit of the liquid discharge apparatus.

A printing apparatus 500 that is the liquid discharge apparatus includes: an importing unit 501 that imports a continuous material 510; a guiding/conveying unit 503 that guides and conveys the continuous material 510 imported through the importing unit 501 to a printing unit 505; the printing unit 505 that performs printing to form an image by discharging liquid onto the continuous material 510; a drying unit 507 that dries the continuous material 510; and an exporting unit 509 that exports the continuous material 510.

The continuous material 510 is sent out from an original winding roller 511 of the importing unit 501, is guided and conveyed by the respective rollers of the importing unit 501, the guiding/conveying unit 503, the drying unit 507, and the exporting unit 509, and is wound up by a wind-up roller 591 of the exporting unit 509.

In the printing unit 505, the continuous material 510 is conveyed on a conveying guide member 559, while facing a head unit 550 and a head unit 555. An image is formed with liquid discharged from the head unit 550, and post-processing is performed with a treatment liquid discharged from the head unit 555.

In the head unit 550, full-line head arrays 551A, 551B, 551C, and 551D for four colors (hereinafter referred to as the "head arrays 551" when the colors are not distinguished from one another) are arranged in this order from the upstream side in the conveying direction, for example.

Each head array 551 is a liquid discharging unit, and discharges liquid of black K, cyan C, magenta M, or yellow Y onto the continuous material 510 being conveyed. Note that the colors and the numbers of the colors are not limited to this example.

As illustrated in FIG. 16, each head array 551 has liquid discharge heads (also referred to simply as "heads") 1 arranged on a base member 552 in a staggered manner, for example. However, the head arrays 551 do not necessarily have this staggered arrangement.

Figure 17:
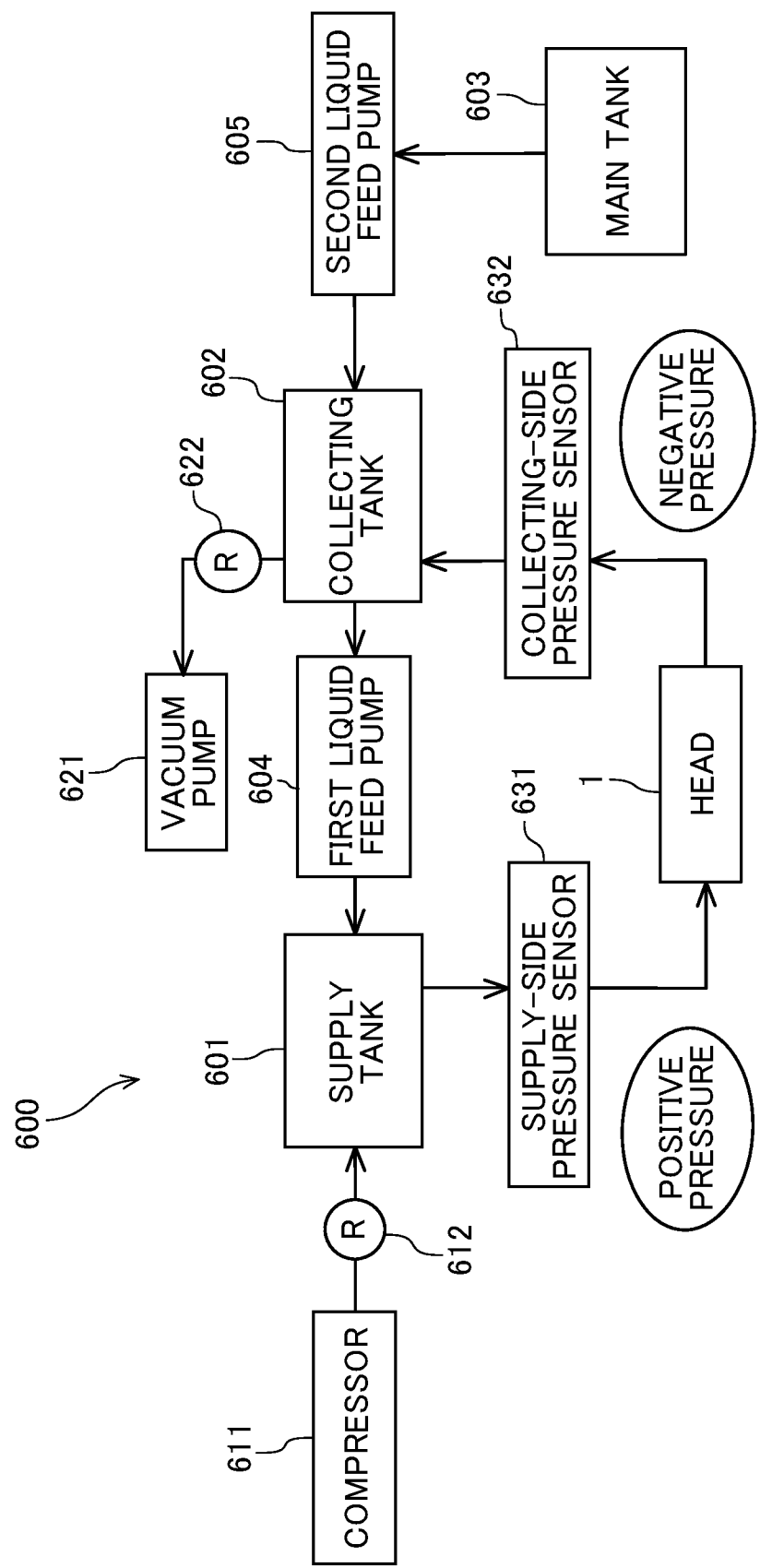
FIG. 17 is an explanatory block diagram of an example of a liquid circulation apparatus.

Referring now to FIG. 17, an example of a liquid circulation apparatus is described. FIG. 17 is an explanatory block diagram of the liquid circulation apparatus. Although only one head is illustrated in this diagram, a plurality of heads may be arranged, and, in that case, the supply sides and the collecting sides of the plurality of heads are connected to a supply-side fluid channel and a collecting-side fluid channel, respectively, via manifolds or the like.

A liquid circulation apparatus 600 includes a supply tank 601, a collecting tank 602, a main tank 603, a first liquid feed pump 604, a second liquid feed pump 605, a compressor 611, a regulator 612, a vacuum pump 621, a regulator 622, a supply-side pressure sensor 631, and a collecting-side pressure sensor 632.

Here, the compressor 611 and the vacuum pump 621 constitute a unit for generating a differential pressure between the pressure in the supply tank 601 and the pressure in the collecting tank 602.

The supply-side pressure sensor 631 is connected to the supply-side fluid channel that is located between the supply tank 601 and the head 1 and is connected to the supply port 61 of the head 1. The collecting-side pressure sensor 632 is connected to the collecting-side fluid channel that is located between the head 1 and the collecting tank 602 and is connected to the collection port 62 of the head 1.

One side of the collecting tank 602 is connected to the supply tank 601 via the first liquid feed pump 604, and the other side of the collecting tank 602 is connected to the main tank 603 via the second liquid feed pump 605.

With this arrangement, liquid flows from the supply tank 601 into the head 1 through the supply port 61 and is collected from the collection port 62 into the collecting tank 602. The liquid is then sent from the collecting tank 602 into the supply tank 601 by the first liquid feed pump 604. In this manner, a circulation path in which the liquid circulates is formed.

In this example, the compressor 611 is connected to the supply tank 601, and control is performed so that a predetermined positive pressure is detected by the supply-side pressure sensor 631. On the other hand, the vacuum pump 621 is connected to the collecting tank 602, and control is performed so that a predetermined negative pressure is detected by the collecting-side pressure sensor 632.

With this arrangement, the negative pressure of the meniscus can be kept constant, while liquid is circulated in the head 1.

When liquid is discharged from the nozzles 11 of the head 1, the liquid amounts in the supply tank 601 and the collecting tank 602 decrease. Therefore, the second liquid feed pump 605 is used as appropriate, so that the collecting tank 602 is replenished with liquid from the main tank 603.

Note that the timing of replenishing the collecting tank 602 with the liquid from the main tank 603 can be controlled in accordance with a result of detection performed by a liquid surface sensor provided in the collecting tank 602. For example, liquid replenishment is performed when the liquid surface height of the liquid in the collecting tank 602 becomes lower than a predetermined height.

In this application, the liquid to be discharged from a liquid discharge head is not limited to any particular liquid, as long as the liquid has such a viscosity or surface tension that the liquid can be discharged from the liquid discharge head. However, the viscosity of the liquid is preferably not higher than 30 mPa·s under ordinary temperature and ordinary pressure, or by heating or cooling. More specifically, the liquid may be a solution, a suspension, or an emulsion containing a solvent such as water or an organic solvent, a colorant such as a dye or a pigment, a functionalizing material such as a polymerizable compound, a resin, or a surfactant, a biocompatible material such as deoxyribonucleic acid (DNA), amino acid, protein, or calcium, an edible material such as a natural pigment, or the like. Any of these liquids can be used as an inkjet ink, a surface treatment liquid, a liquid for forming components or an electronic circuit resist pattern for electronic elements or light-emitting elements, a three-dimensional modeling material solution, or the like.

Examples of an energy source for generating energy to discharge liquid include a piezoelectric actuator (a laminated piezoelectric element or a thin-film piezoelectric element), a thermal actuator that employs a thermoelectric conversion element, such as a heating resistor, and an electrostatic actuator including a diaphragm and opposed electrodes.

A "liquid discharge device" is formed by integrating functional components and mechanisms in a liquid discharge head and is an assembly of components relating to liquid discharge. For example, a "liquid discharge device" may include a combination of a liquid discharge head and at least one of a head tank, a carriage, a supply mechanism, a maintenance/recovery mechanism, and a main-scanning movement mechanism.

Examples of the integrated structure include a combination in which a liquid discharge head, functional components, and mechanisms are secured to one another by fastening, bonding, or engaging, for example, and a combination in which one of the head and each component is movably supported by the other. Alternatively, the liquid discharge head, the functional components, and the mechanisms may be detachably attached to one another.

An example of the liquid discharge device is a combination of a liquid discharge head and a head tank. Alternatively, the liquid discharge head and the head tank are integrally connected to each other with a tube or the like. In this case, a unit that includes a filter may be added between the head tank and the liquid discharge head of the liquid discharge device.

Alternatively, a liquid discharge head and a carriage are integrated, to form a liquid discharge device.

Further, an example of a liquid discharge device is a structure in which a liquid discharge head is movably supported by a guide member that forms part of a scanning moving mechanism, and the liquid discharge head and the scanning moving mechanism are integrated. Yet another example of a liquid discharge device is a structure in which a liquid discharge head, a carriage, and a main-scanning movement mechanism are integrated.

Another example of a liquid discharge device is a structure in which a cap member that is part of a maintenance/recovery mechanism is secured to a carriage to which a liquid discharge head is attached, and the liquid discharge head, the carriage, and the maintenance/recovery mechanism are integrated.

Yet another example of a liquid discharge device is a structure in which a tube is connected to a liquid discharge head to which a head tank or channel components are attached, and the liquid discharge head and a supply mechanism are integrated. Through this tube, the liquid in the liquid storage source is supplied to the liquid discharge head.

The main-scanning movement mechanism may be formed only with a guide member. The supply mechanism may be formed only with a tube or a loading member.

A "liquid discharge apparatus" may be an apparatus that includes a liquid discharge head or a liquid discharge device and drives the liquid discharge head to discharge liquid. The liquid discharge apparatus may be an apparatus capable of discharging liquid into air or liquid, instead of an apparatus capable of discharging liquid onto a medium to which liquid can adhere.

This "liquid discharge apparatus" may also include devices relating to feed, conveyance, and paper ejection of a medium to which liquid can adhere, a preprocessing device, and a post-processing device.

For example, a "liquid discharge apparatus" may be an image forming apparatus that forms an image on a paper sheet by discharging ink, or a stereoscopic modeling apparatus (a three-dimensional modeling apparatus) that discharges a modeling liquid onto a powder layer formed from powder, to model a stereoscopic model (a three-dimensional model).

A "liquid discharge apparatus" is not necessarily an apparatus that discharges liquid to visualize meaningful images, such as characters or figures. For example, a liquid discharge apparatus may form meaningless images, such as meaningless patterns, or form three-dimensional images.

The "medium to which liquid can adhere" means a medium to which liquid can at least temporarily adhere, a medium to which liquid adheres and sticks, a medium to which liquid adheres and penetrates, or the like. Specific examples of such media include media onto which recording is performed, such as paper sheets, recording paper, recording sheets, film, and cloth, electronic substrates, elements such as piezoelectric elements, powder layers (powdery layers), organ models, test cells. The specific examples include all media to which liquid can adhere, unless otherwise specified.

The above material of the "medium to which liquid can adhere" should be a medium to which liquid can at least temporarily adhere, such as paper, thread, fiber, cloth, leather, metal, plastic, glass, wood, or ceramics.

Alternatively, a "liquid discharge apparatus" may be an apparatus in which a liquid discharge head and a medium to which liquid can adhere move relative to each other but is not necessarily such an apparatus. Specific examples of such apparatuses include a serial-type apparatus that moves the liquid discharge head, and a line-type apparatus that does not move the liquid discharge head.

Further, a "liquid discharge apparatus" may be a treatment liquid application apparatus that discharges a treatment liquid onto a paper sheet to apply the treatment liquid onto the surface of the paper sheet and modify the surface of the paper sheet, or an injecting granulation apparatus that granulates fine particles of a raw material by spraying a composition liquid containing the raw material dispersed in a solution through a nozzle, or the like.

Note that the terms "image formation", "recording", "printing", "image printing", and "modeling" used herein are all synonymous.

Further, an electronic device according to the present disclosure is not necessarily a wiring member or a piezoelectric element. An electronic device according to the present disclosure can also be used in an electronic apparatus that is not a liquid discharge apparatus, such as a display device or a personal computer.

Further, a "drive element" is not limited to a piezoelectric element that drives mechanically but also includes an element that drives electrically such as an electronic element or a light-emitting element in a display.

Numerous additional modifications and variations are possible in light of the above teachings. It is therefore to be understood that, within the scope of the above teachings, the present disclosure may be practiced otherwise than as specifically described herein. With some embodiments having thus been described, it will be obvious that the same may be varied in many ways. Such variations are not to be regarded as a departure from the scope of the present disclosure and appended claims, and all such modifications are intended to be included within the scope of the present disclosure and appended claims.

What is claimed is:
1. An electronic device comprising:
a switching element;
a first common-electrode wiring, at least a part of the first common-electrode wiring being covered with the switching element;
a plurality of second common-electrode wirings branched from the part of the first common-electrode wiring covered with the switching element;
a plurality of individual power-output terminals arranged in a row in the switching element;
a plurality of individual-electrode wirings arranged in a row, the plurality of individual-electrode wirings being connected to the plurality of individual power-output terminals, respectively; and
a wider region in which an interval between adjacent ones of the plurality of individual power-output terminals is wider than an interval between other adjacent ones of the individual power-output terminals,
wherein each of the plurality of second common-electrode wirings is disposed between the plurality of individual-electrode wirings, and
at least one of the plurality of second common-electrode wirings is arranged in the wider region.

2. The electronic device according to claim 1,
wherein the wider region is disposed for every predetermined numbers of the plurality of individual power-output terminals.

3. The electronic device according to claim 1,
wherein one of the plurality of second common-electrode wirings is provided for n-numbers of the plurality of individual power-output terminals, and
a ratio of a width of one of the plurality of individual-electrode wirings to a width of one of the plurality of second common-electrode wirings is 1/n to one.

4. The electronic device according to claim 1,
wherein the switching element includes a power-input terminal to supply a power to the plurality of individual power-output terminals, and
the first common-electrode wiring is disposed between the power-input terminal of the switching element and the plurality of individual power-output terminals.

5. The electronic device according to claim 1, further comprising a plurality of drive elements connected to the plurality of individual-electrode wirings, respectively,
wherein a number of the second common-electrode wirings per a number of the plurality of individual power-output terminals at a first portion, in which temperature of the plurality of drive elements increases during driving of the plurality of drive elements, is larger than a number of the second common-electrode wirings per a number of the plurality of individual power-output terminals at a second portion, in which temperature of the plurality of drive elements becomes lower than the first portion during driving of the plurality of drive elements.

6. A liquid discharge head comprising the electronic device according to claim 1.

7. A liquid discharge device comprising the liquid discharge head according to claim 6.

8. A liquid discharge apparatus comprising the liquid discharge device according to claim 7.

9. An electronic apparatus comprising the electronic device according to claim 1.

10. An electronic device comprising:
a switching element;
a first common-electrode wiring, at least a part of the first common-electrode wiring being covered with the switching element;
a plurality of second common-electrode wirings branched from the part of the first common-electrode wiring covered with the switching element;
a plurality of individual power-output terminals arranged in a row in the switching element;
a plurality of individual-electrode wirings arranged in a row, the plurality of individual-electrode wirings being connected to the plurality of individual power-output terminals, respectively; and
a power supply to supply power to the first common-electrode wiring,
wherein each of the plurality of second common-electrode wirings is disposed between the plurality of individual-electrode wirings, and
a number of the plurality of second common-electrode wirings per resistance of the first common-electrode wiring in a first portion of the first common-electrode wiring far from the power supply is larger than a number of the plurality of second common-electrode wirings per resistance of the first common-electrode wiring in a second portion of the first common-electrode wiring close to the power supply.

11. The electronic device according to claim 10,
wherein the power supply supplies power to both ends of the first common-electrode wiring in a longitudinal direction of the switching element, and
the number of the plurality of second common-electrode wirings per resistance of the first common-electrode wiring in the first portion close to a central part of the first common-electrode wiring is larger than the number of the plurality of second common-electrode wirings per resistance of the first common-electrode wiring in the second portion close to each end of the first common-electrode wiring.

12. The electronic device according to claim 10,
wherein one of the plurality of second common-electrode wirings is provided for n-numbers of the plurality of individual power-output terminals, and
a ratio of a width of one of the plurality of individual-electrode wirings to a width of one of the plurality of second common-electrode wirings is 1/n to one.

13. The electronic device according to claim 10,
wherein the switching element includes a power-input terminal to supply a power to the plurality of individual power-output terminals, and
the first common-electrode wiring is disposed between the power-input terminal of the switching element and the plurality of individual power-output terminals.

14. A liquid discharge head comprising the electronic device according to claim 10.

15. A liquid discharge device comprising the liquid discharge head according to claim 14.

16. A liquid discharge apparatus comprising the liquid discharge device according to claim 15.

17. An electronic device comprising:
a switching element;
a first common-electrode wiring, at least a part of the first common-electrode wiring being covered with the switching element;
a plurality of second common-electrode wirings branched from the part of the first common-electrode wiring covered with the switching element;
a plurality of individual power-output terminals arranged in a row in the switching element;
a plurality of individual-electrode wirings arranged in a row, the plurality of individual-electrode wirings being connected to the plurality of individual power-output terminals, respectively; and
a power supply to supply power to both ends of the first common-electrode wiring in a longitudinal direction of the switching element,
wherein each of the plurality of second common-electrode wirings is disposed between the plurality of individual-electrode wirings, and
a number of the plurality of second common-electrode wirings per a number of the plurality of individual power-output terminals close to a central part of the first common-electrode wiring is larger than the number of the plurality of second common-electrode wirings per the number of the plurality of individual power-output terminals close to each end of the first common-electrode wiring.

18. The electronic device according to claim 17,
wherein one of the plurality of second common-electrode wirings is provided for n-numbers of the plurality of individual power-output terminals, and
a ratio of a width of one of the plurality of individual-electrode wirings to a width of one of the plurality of second common-electrode wirings is 1/n to one.

19. The electronic device according to claim 17,
wherein the switching element includes a power-input terminal to supply a power to the plurality of individual power-output terminals, and
the first common-electrode wiring is disposed between the power-input terminal of the switching element and the plurality of individual power-output terminals.

20. A liquid discharge head comprising the electronic device according to claim 17.

21. A liquid discharge device comprising the liquid discharge head according to claim 20.

22. A liquid discharge apparatus comprising the liquid discharge device according to claim 21.

* * * * *